US006499426B1

(12) United States Patent
Windischmann et al.

(10) Patent No.: US 6,499,426 B1
(45) Date of Patent: *Dec. 31, 2002

(54) SYSTEM AND METHOD FOR COATING NON-PLANAR SURFACES OF OBJECTS WITH DIAMOND FILM

(75) Inventors: Henry Windischmann, Northboro, MA (US); Cecil B. Shepard, Jr., Laguna Niguel, CA (US); Donald O. Patten, Jr., Sterling, MA (US)

(73) Assignee: Saint-Gobain Industrial Ceramics, Inc., Worcester, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/460,337

(22) Filed: Dec. 10, 1999

(51) Int. Cl.[7] ................................. C23C 4/10
(52) U.S. Cl. ............... 118/723 R; 118/715; 118/723 E; 219/76.16
(58) Field of Search .................. 118/723 MP, 723 HC, 118/723 ME, 723 DC, 723 R, 65; 123/143 B; 219/121.47, 121.48, 121.39, 121.59, 121.44, 121.52, 121.36, 121.45, 121.49, 121.63; 427/233, 248.1, 249.13, 456, 554, 580, 597, 8; 428/216, 328, 336, 339, 545, 607; 423/337

(56) References Cited

U.S. PATENT DOCUMENTS

| | | | |
|---|---|---|---|
| 3,899,573 A | * 8/1975 | Shaw et al. ................. | 423/337 |
| 4,022,928 A | 5/1977 | Piwcyzk ...................... | 427/43 |
| 4,364,342 A | * 12/1982 | Asik ....................... | 123/143 B |
| 5,204,145 A | 4/1993 | Gasworth ................... | 427/577 |
| 5,342,660 A | 8/1994 | Cann et al. ................. | 427/577 |
| 5,560,779 A | * 10/1996 | Knowles et al. ....... | 118/723 MP |
| 5,672,430 A | 9/1997 | Lu et al. ..................... | 428/408 |
| 5,916,370 A | 6/1999 | Chang ....................... | 118/729 |

FOREIGN PATENT DOCUMENTS

| | | | | |
|---|---|---|---|---|
| EP | 0090586 A1 | | 10/1983 | .......... C23C/11/00 |
| EP | 0418554 A2 | | 3/1991 | .......... C23C/16/04 |
| EP | 0502657 A1 | | 9/1992 | .......... C30B/29/04 |
| JP | 8-124517 | * | 5/1996 | .......... H01J/49/10 |

* cited by examiner

*Primary Examiner*—Gregory Mills
*Assistant Examiner*—Rudy Zervigon
(74) *Attorney, Agent, or Firm*—David P. Gordon; David S. Jacobson; Thomas A. Gallagher

(57) ABSTRACT

A system and method for depositing a CVD diamond coating on a non-planar surface of an object is provided. The system includes a deflector having a deflecting surface which resists diamond coating by the diamond forming reagents produced by the system and which is adapted to withstand the relatively high deposition temperatures is provided. The deflector is positioned substantially axially with an axis of the distribution head of the CVD engine. The deflector is preferably generally wedge-shaped or conical and coupled to a motor which is adapted to rotate the deflector at a relatively high speed. A mandrel may be positioned about or to one side of the deflector. The deflector is oriented with respect to the distribution head and the mandrel such that a jet exiting the distribution head is deflected by the deflector onto a surface of an object positioned on the mandrel. The object surface may be non-planar.

19 Claims, 3 Drawing Sheets

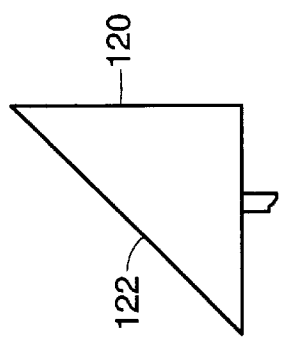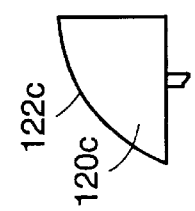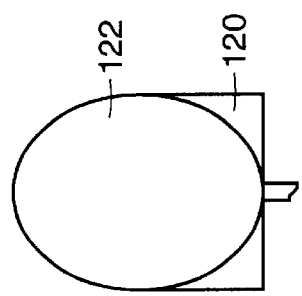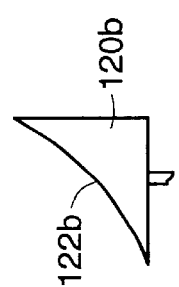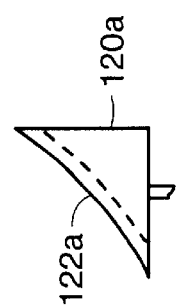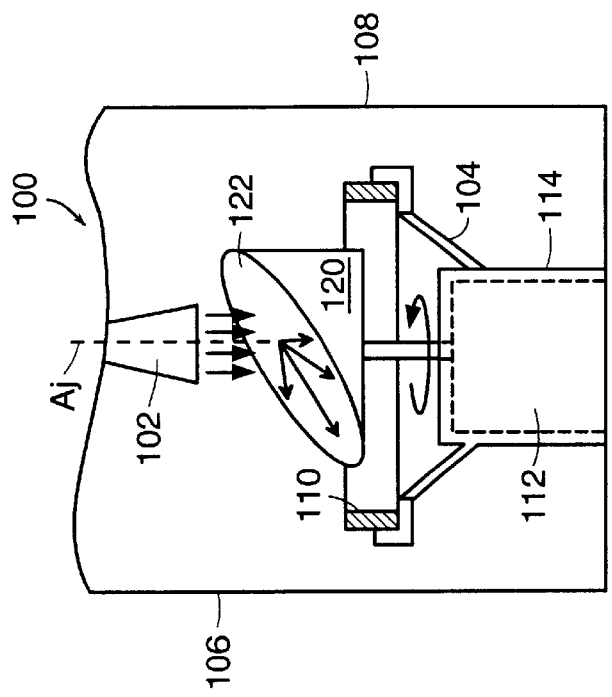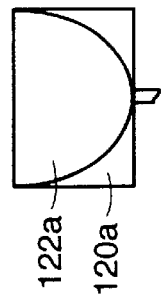

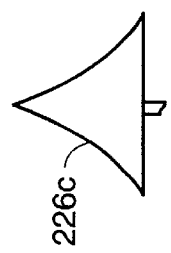
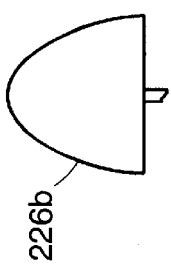
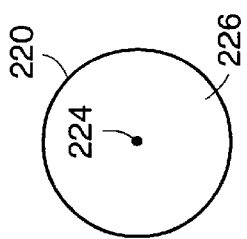
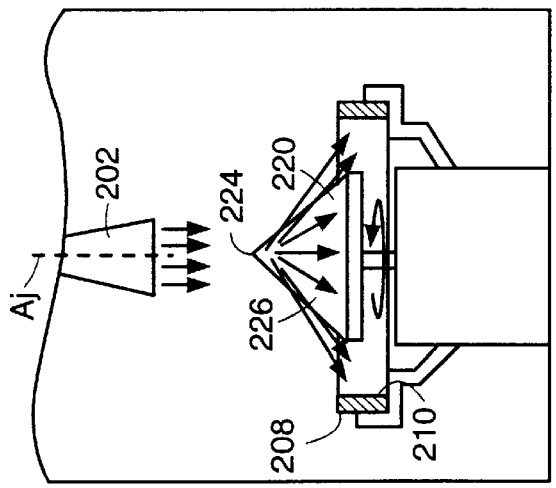
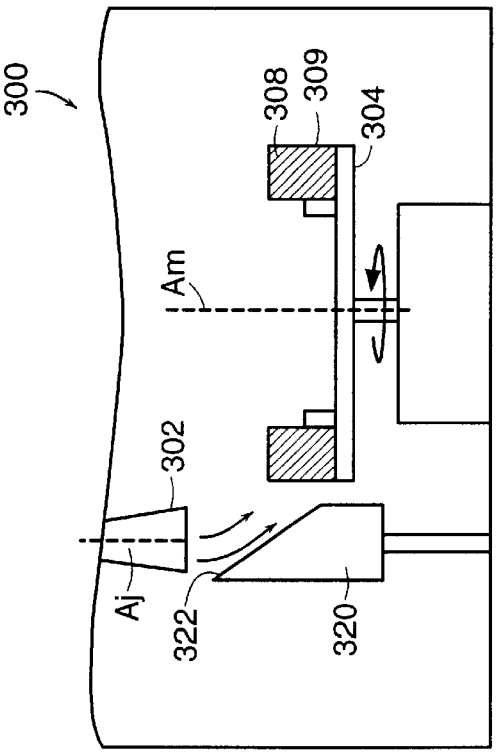

SYSTEM AND METHOD FOR COATING NON-PLANAR SURFACES OF OBJECTS WITH DIAMOND FILM

BACKGROUND OF THE INVENTION

1. Field of the Invention

This invention relates broadly to a system and method for depositing diamond coatings on surfaces. More particularly, this invention relates to a system and method for coating a diamond film on a non-planar surface.

2. State of the Art

The utility of high quality diamond films for various applications is well known. Superior physical, chemical, and electrical properties make diamond films desirable for many mechanical, thermal, optical and electronic applications. For example, diamond has the highest room-temperature thermal conductivity of any material, a high electric field breakdown ($-10^7$V/cm), and an air stable negative electron affinity. These properties make possible high power, high frequency transistors and cold cathodes which cannot be made with any semiconductor other than diamond. In addition, the etch-resistance of diamond coatings, makes such coatings ideal for components of semiconductor etching devices.

One method for producing thin diamond coatings is by using a chemical vapor deposition (hereinafter 'CVD') system. In CVD systems, a mixture of hydrogen and a gaseous hydrocarbon, such as methane, is activated and contacted with a substrate to produce a diamond coating on the substrate. The hydrogen gas is disassociated into atomic hydrogen, which is then reacted with the hydrocarbon to form condensable carbon radicals. The carbon radicals are then deposited on a substrate to form a diamond film.

One manner of practicing CVD is with a plasma jet system. Referring to prior art FIG. 1, a plasma jet system 10 includes an engine 12 having a hydrogen gas inlet 14, a cathode 16, an engine wall 18, and an anode 20. The system 10 further includes a gas injection disc 22 having a plurality of injectors 24, a distribution head (nozzle) 26 which is directed toward a mandrel 28 on which a substrate 30 may be located, and a vacuum deposition chamber 32 surrounding the engine 12, the gas injection disc 22, the distribution head 26, and the mandrel 28. In operation, atomic hydrogen gas is introduced through the hydrogen gas inlet 14 and formed into a hydrogen plasma jet by means of a direct current arc, an alternating current arc, or microwave energy within the engine. The plasma torch is hot enough (typically approximately 10,000°K) to reduce gases to their elemental form. Hydrocarbon reagents are then introduced from the injectors 24 of the gas injection disc 22 into the plasma torch, and the torch is directed into the distribution head 26 such that a jet of the condensable reagents exits the distribution head and is directed toward the substrate 30 on the mandrel 28. The mandrel 28 is oriented normal to the distribution head 26 such that the jet is directed at the substrate 30 in a line-of-sight manner, and a diamond coating is created on the substrate.

For coating planar surfaces of objects larger than the jet and also for obtaining uniformity of coating and elimination of hot spots which may reduce the quality of the coating through the formation of temperature gradients, it may be advantageous to rotate the object beneath the distribution head, as described in U.S. Pat. No. 5,342,660 and as shown in FIG. 1.

However, when coating a non-planar surface, e.g., the inside surface of an object such as a ring or bowl, particularly where the inner diameter increases in a direction away from the jet, the line-of-sight nature of the jet makes it difficult to obtain a uniform coating or any coating at all in some areas. In addition, while rotation of an object is typically preferred for coating uniformity and minimization of temperature gradients, it may be impractical or impossible to rotate, within the confines of the chamber, objects which are relatively large, oblong, complex, and/or awkward (i.e., having an off-axis center of gravity). Moreover, even if it were possible to rotate or otherwise move large, oblong, complex, and/or awkward objects within the chamber, it may not be feasible or practical to do such at a speed which would minimize the temperature gradient to which the surface of the object would be subject.

For the foregoing reasons, there is needed a system and method for depositing diamond coatings on objects having non-planar surfaces, such that the coating is applied in a substantially uniform thickness while minimizing temperature gradients.

SUMMARY OF THE INVENTION

The present invention is a novel system and method for depositing a CVD diamond coating on a non-planar surface of an object. The system includes a deflector having a deflecting surface which resists diamond coating as well as a conventional plasma jet engine, injection disc, distribution head, and mandrel on which a substrate object may be provided. At least the exit of the distribution head and the mandrel are contained within a vacuum deposition chamber.

According to several embodiments of the invention particularly suited for coating inner diameter surfaces of objects, the deflecting surface of the deflector resists diamond coating by diamond forming reactive reagents produced by the system and is adapted to withstand the relatively high deposition temperatures. The deflector is positioned substantially axially relative to an axis of the distribution head, and thereby relative to the axis of the jet exiting the distribution head. The deflector is preferably generally wedge-shaped or conical and coupled to a motor which is adapted to rotate the deflector at a relatively high speed. The mandrel may be positioned partially or completely around the deflector. The deflector is oriented with respect to the distribution head and the mandrel such that a jet exiting the distribution head is deflected by the deflector onto a surface of the object positioned on the mandrel. The object surface may be non-planar.

According to another embodiment of the invention particularly adapted for coating the outer diameter surface of a ring-shaped object or a perimeter portion of a non-circular object, a rotatable mandrel is adapted to rotate an object non-axially relative to the jet from the distribution head. A preferably stationary deflector is situated beneath the distribution head and oriented to deflect the jet from the distribution head toward the non-planar surface object. When the object is rotated on the mandrel, its outer diameter or perimeter portion is coated with a diamond coating by the jet.

The several embodiments of the invention provide systems adapted to coat diamond films on non-planar surfaces. Additional advantages of the invention will become apparent to those skilled in the art upon reference to the detailed description taken in conjunction with the provided figures.

BRIEF DESCRIPTION OF THE DRAWINGS

FIG. 2 is a broken partial section of a first embodiment of a plasma jet vapor deposition system utilizing a first embodiment of a wedge-shaped deflector which directs reactive condensible reagents exiting a distribution head of the system onto a non-planar surface to form a diamond coating thereon;

FIG. 3 is a front view of a first embodiment of the deflector of the first embodiment of the invention;

FIG. 4 is a side view of the first embodiment of the deflector of the first embodiment of the invention;

FIG. 5 is a front view of a second embodiment of the deflector of the first embodiment of the invention;

FIG. 6 is a side view of the second embodiment of the deflector;

FIG. 7 is a side view of a third embodiment of the deflector;

FIG. 8 is a side view of a fourth embodiment of the deflector;

FIG. 9 is a broken partial section of a second embodiment of the plasma jet vapor deposition system utilizing a conical deflector;

FIG. 10 is a top view of the deflector of the second embodiment of the invention;

FIG. 11 is a side view of an alternate conical deflector;

FIG. 12 is a side view of another alternative conical deflector; and

FIG. 13 is a broken partial section of a third embodiment of a plasma jet vapor deposition system utilizing a deflector which directs reactive condensible reagents exiting a distribution head of the system onto a non-planar surface to form a diamond coating thereon.

DETAILED DESCRIPTION OF THE PREFERRED EMBODIMENTS

Figure 1:
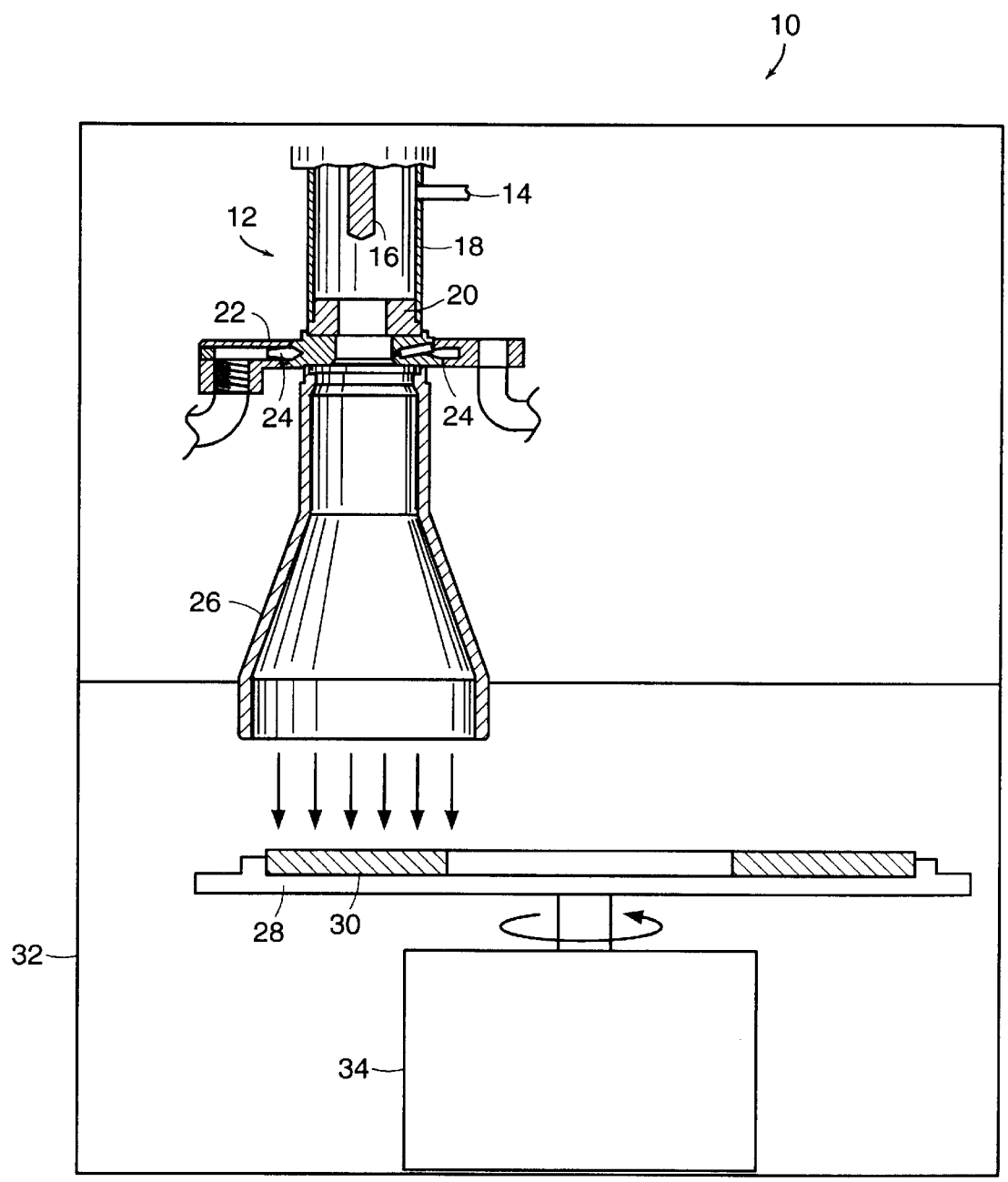
FIG. 1 is a partial section view of a prior art plasma jet vapor deposition system.

Turning now to FIGS. 2 and 3, a plasma jet vapor deposition system 100 for diamond coating of non-planar surfaces of objects is provided. The system generally includes all the elements described with respect to prior art FIG. 1, although not all the elements are shown. The system 100 particularly includes a distribution head 102 and a mandrel 104 within a deposition chamber 106. The mandrel 104 is preferably coupled to a stationary element (e.g., a motor housing 114, described below) within the chamber 106.

According to a preferred aspect of the invention, a deflector 120 is provided axially with respect to the distribution head 102, and centrally with respect to a portion of the mandrel 104 such that an object 108 having a non-planar surface 110 and positioned on the mandrel 104 will have its non-planar surface at least partially surround the deflector 120. The deflector 120 is coupled to a motor 112 within the motor housing 114. The motor 112 is configured to rotate the deflector about an axis $A_j$ of a jet exiting the distribution head. The deflector 120 includes a deflecting surface 122 adapted to deflect the jet radially. To that end, the deflecting surface 122 must resist formation of a diamond coating by the reactive agents from the jet, and must be capable of withstanding high deposition temperatures, e.g., up to 750° C. or higher. Examples of suitable materials for the deflecting surface include copper, aluminum, copper plated molybdenum, nickel, titanium nitride, and zirconium nitride, though other suitable materials may be used. Such materials may comprise substantially an entirety of the deflector or, alternatively, may be coated on a relatively different supporting refractory material, e.g., graphite, to form the deflector.

Referring to FIGS. 2 through 4, according to a first embodiment of the deflector 120 the deflector is a cylindrical or rectangular wedge having a sloped, substantially planar deflecting surface 122. The angle of the slope of the surface 122 of the selected deflector is preferably chosen to best direct the reactive reagents toward the contour of the surface to be coated. That is, when coating a vertical wall about an interior diameter of a ring, the desired slope may be different than when coating a tapered wall on an interior diameter of a ring. The deflecting surface 122 is adapted to deflect the jet reagents in a radial direction relative to the axis of the jet exiting the distribution head. As the deflector 120 rotates, the jet is directed in all radial directions.

The wedge-shaped deflector may alternatively include a deflecting surface which is curved. Turning to FIGS. 5 and 6, a deflector 120a includes a 'horizontally' (side to side) concave surface 122a defined by a plurality of horizontally arranged curves. Turning to FIG. 7, a deflector 120b may also include a 'vertically' (top to bottom) concave surface 122b defined by a plurality of vertically arranged curves. Moreover, referring to FIG. 8, a deflector 120c may also have a convex deflector surface 122c.

It will be appreciated by those skilled in the art that the particular preferred shape of the deflector surface will depend on the configuration of the surface to be coated with a diamond film. In fact, computer simulation may be utilized to construct and locate the deflector, accounting for the velocity of the plasma, the distribution of the plasma, the shape and location of the substrate, etc.

Turning to FIGS. 9 and 10, according to a second embodiment of the invention, the deflector 220 is generally conical; i.e., having an axially central highest point (zenith) 224 and slope downwards on all sides 226 therefrom. The zenith 224 is positioned substantially co-linear with the axis $A_j$ of the jet exiting the distribution head. As the jet exits the distribution head 202, the jet deflects off the sides 226 radially in all directions toward the non-planar surface 210 of the object 208. If desired, the deflector 220 may be rotated to prevent any non-uniformity of coating which could result due to misalignment of the deflector relative to the axis $A_j$ of the jet. In addition, rotation of the deflector permits the deflector to be constructed with lesser manufacturing tolerances.

Referring to FIGS. 11 and 12, the conical deflector may alternatively be provided with concave sides 226b or convex sides 226c. Once again, the particular preferred shape of the sides of the deflector surface will depend on the configuration of the surface to be diamond coated.

With respect to the both the first and second embodiments of the invention, it will be appreciated that while it is preferable to rotate the deflector on a motor relative to a mandrel on which the object is provided, the mandrel may alternatively or additionally be rotated relative to the deflector. That is, the mandrel may be rotated about a stationary deflector, or the mandrel may be rotated in a direction opposite a rotating deflector. Moreover, while not preferred, both the deflector and mandrel may be rotated in the same direction at different speeds such that the deflector and mandrel are rotated relative to each other. In each case, uniformity of coating is assured and temperature gradients are minimized.

Turning to FIG. 13, according to third embodiment of the invention, the system 300 includes a rotatable mandrel 304 on which an object 308 may be provided such that an outer non-planar surface 309 of the object, such as an outer diameter surface, may be coated. The mandrel rotates about an axis $A_m$ which is typically parallel, but not co-linear with the axis $A_j$ of the jet. A preferably wedge-shaped deflector 320 is stationarily positioned beneath the distribution head 302 and includes a deflecting surface 322 which is intersected by jet axis $A_j$. As the jet from the distribution head is deflected by the deflector 320 (due to fluid flow characteristics), and as the object is rotated on the mandrel, a diamond coating is provided on the outer non-planar surface of the object.

In addition, a similar system with multiple (e.g., four) rotating mandrels, each with an object provided thereon, and a central preferably rotating conical deflector may also be used. Such a system would permit the use of one distribution head to simultaneously diamond coat the outer surface of multiple objects.

While particular materials for the deflector and the deflector surface have been disclosed, it will be appreciated that other suitable materials may be used as well. In general, the materials most useful for the deflector are those which do not tend to form carbides. Whether diamond deposits on the deflector material depends in part on the temperature of the deflector. The plasma jet can impart considerable heat to the deflector surface. Therefore, depending upon the enthalpy and size of the plasma jet, it may be advantageous for the deflector to be actively cooled, such as by having cooling fluid circulating in its interior via the mounting shaft or by attaching heat radiating fins to it to improve radiational cooling.

While particular shapes of deflectors have been disclosed, it will be understood that other deflector shapes, e.g., pyramidal, can also be used. The deflector may also be in the form of a flat or shaped sheet of material instead of a sectioned larger solid shape. Also, the deflector may be used in combination with the tilted mandrel taught in U.S. Pat. No. 5,342,660, which is hereby incorporated by reference herein in its entirety, or a similar tilting mandrel. Furthermore, while the deflector is shown without direct attachment to the distribution head, it will be appreciated that a rotating or stationary deflector may be coupled directly to the distribution head. Moreover, while a motor has been described for rotating the deflector, it will be appreciated that other devices, e.g., engines or belt systems, may also be used therefor. Also, while it has been shown to diamond coat the inner and outer diameter portions of ring-shaped objects, it will be appreciated that any object having a non-planar surface, e.g., the narrowed opening of a bowl-shaped object, may also be diamond coated with the described system and in the described manner.

What is claimed is:

1. A plasma jet CVD system for depositing a diamond coating on a substrate surface of an object, comprising:
    a) a plasma jet system having a means for producing a diamond coating producing plasma jet and a distribution head through which said plasma jet exits, said distribution head defining a jet axis;
    b) a mandrel defining a plane on which the object is positionable and a central mandrel axis perpendicular to said plane;
    c) a deflector having a deflecting surface intersecting said jet axis and angled relative to both said jet axis and said plane, said deflector causing said plasma jet exiting said distribution head to deflect away from said mandrel axis; and
    d) a deposition chamber surrounding at least a portion of said distribution head, said mandrel, and said deflector, wherein at least one of said deflector and said mandrel rotates about an axis which is normal to said plane.

2. A plasma jet CVD system according to claim 1, further comprising:
    e) means for rotating said deflector substantially about said jet axis.

3. A plasma jet CVD system according to claim 1, wherein:
    said deflector is one of generally wedge-shaped and generally conical.

4. A plasma jet CVD system according to claim 1, wherein:
    said deflector is comprised of at least one of graphite, copper, aluminum, titanium nitride, and zirconium nitride.

5. A plasma jet CVD system according to claim 1, wherein:
    said deflecting surface is resistant to diamond coating.

6. A plasma jet CVD system according to claim 1, wherein:
    said deflecting surface is planar.

7. A plasma jet CVD system according to claim 1, wherein:
    said deflecting surface is substantially conical.

8. A plasma jet CVD system according to claim 1, wherein:
    said deflecting surface is one of convex or concave.

9. A plasma jet CVD system according to claim 1, wherein:
    said jet axis intersects said deflecting surface.

10. A plasma jet CVD system according to claim 1, wherein:
    at least one of said deflector and said mandrel is rotatable relative to the other.

11. A plasma jet CVD system according to claim 1, further comprising:
    e) an object having a non-planar surface,
       wherein said deflector is adapted to deflect said plasma jet onto said non-planar surface.

12. A plasma jet CVD system according to claim 11, wherein:
    said object at least partially surrounds said deflector.

13. A plasma jet CVD system according to claim 12, wherein:
    said object is located 360° around said deflector.

14. A plasma jet CVD system for depositing a diamond coating on a substrate surface of an object, comprising:
    a) a plasma jet system having a means for producing a plasma jet and a distribution head through which said plasma jet exits, said distribution head defining a jet axis:
    b) a mandrel defining a plane on which the object is positionable, said mandrel having a mandrel axis about which said mandrel rotates, said mandrel axis being normal to said plane, and said jet axis being parallel to, but not collinear with said mandrel axis;
    c) a deflector having a deflecting surface intersecting said jet axis and angled at other than a right angle relative to both said jet axis and said plane; and
    d) a deposition chamber surrounding at least a portion of said distribution head, said mandrel, and said deflector.

15. A plasma jet CVD system according to claim 14, further comprising:
    e) the object, said object having a non-planar surface,
       wherein said deflector is adapted to deflect said plasma jet onto said non-planar surface.

16. A plasma jet CVD system according to claim 15, wherein:

said non-planar surface is an outer surface of said object.

17. A plasma jet CVD system, comprising:

a) an object having at least one non-planar surface;

b) a plasma jet system having a means for producing a diamond deposition plasma jet and a distribution head through which said plasma jet exits, said distribution head defining a jet axis;

c) a mandrel defining a plane on which said object is positioned;

d) a deflector having a deflecting surface intersecting said jet axis and angled relative to both said jet axis and said plane, said deflector causing said plasma jet exiting said distribution head to deflect toward said non-planar surface of said object so that a diamond coating is produced by said plasma jet on said non-planar surface of said object; and e) a deposition chamber surrounding at least a portion of said distribution head, said mandrel, and said deflector.

18. A plasma jet CVD system according to claim 17, further comprising:

means for rotating said mandrel about a mandrel axis normal to said plane.

19. A plasma jet CVD system according to claim 17, further comprising:

means for rotating said deflector about an axis normal to said plane.

* * * * *